United States Patent [19]
Inoue et al.

[11] Patent Number: 5,356,738
[45] Date of Patent: Oct. 18, 1994

[54] RETICLE COMPRISING PHASE SHIFTER WITH A TAPERED EDGE

[75] Inventors: Hiroyuki Inoue; Kenji Anzai; Kimiaki Tanaka, all of Tokyo, Japan

[73] Assignee: Nippon Steel Corporation, Tokyo, Japan

[21] Appl. No.: 813,030

[22] Filed: Dec. 24, 1991

[30] Foreign Application Priority Data

Dec. 28, 1990 [JP] Japan ............................ 2-416009

[51] Int. Cl.$^5$ .............................................. G03F 9/00
[52] U.S. Cl. ...................................... 430/5; 430/321; 430/325
[58] Field of Search ............... 430/5, 321, 325, 22, 430/269, 396

[56] References Cited

U.S. PATENT DOCUMENTS 4,762,396  8/1988  Dumant et al. .................... 430/5
5,045,417  9/1991  Okamoto ........................... 430/5

FOREIGN PATENT DOCUMENTS 57-62052  4/1982  Japan.

OTHER PUBLICATIONS

Marsato Shibuya, "Original Plate To Be Projected For Use In Transmission Illumination", Apr. 1982 JP 57-62052 (Abstract Only).

J. Miyazaki, et al., "A study of phase shifting mask construction applied for positive resist process", Association of Applied Physics, 27P-ZG-6, Collection of Preliminary Sectures at 1990 Autumn Meeting, 1 page (Drawing only).

Primary Examiner—Steve Rosasco
Attorney, Agent, or Firm—Cushman, Darby & Cushman

[57] ABSTRACT

The edge of a 180° phase shifter on a glass substrate of a reticle has a tapered structure, and a reduction of the intensity of transmitted light by an interference in the boundary area between the phase shifter and the glass substrate is moderated.

14 Claims, 3 Drawing Sheets

RETICLE COMPRISING PHASE SHIFTER WITH A TAPERED EDGE

BACKGROUND OF THE INVENTION

1. Field of the Invention

The present invention relates to a reticle used as a mask for forming a device pattern on a semiconductor wafer, at the photolithographic step in the production of a semiconductor. More particularly, the present invention relates to a reticle having a phase shifter capable of providing a fine pattern.

2. Description of the Related Art

According to the conventional phase shifting method, in the boundary area between a glass substrate of a reticle and a 180° phase shifter the light intensity is reduced and an unnecessary pattern is formed. As a reticle overcoming this disadvantage, there is known a reticle having a multiple-stage phase shifter, whereby the phase shift quantity is stepwise changed, arranged between the glass substrate portion of the reticle and the 180° phase shifter, as disclosed in 27P-ZG-6 of Collection of Preliminary Lectures at the '90 autumn meeting of Association of Applied Physics. FIG. 3a is a diagram illustrating the sectional structure of the reticle having this structure. In FIG. 3a, reference numeral 2 represents a reticle, reference numeral 7 represents a 180° phase shifter, and reference numeral 8 represents a 90° phase shifter. A reticle having a similar structure is disclosed in Japanese Unexamined Patent Publication No. 57-62052.

In the reticle having the above-mentioned structure, as shown in FIG. 3b, a reduction of the light intensity at the wafer during the light exposure can be controlled in the boundary area between the glass substrate and the 180° phase shifter.

Nevertheless, the conventional multiple-stage phase shifter forming process is disadvantageous in that, since it is necessary to form a plurality of shifter films having a precisely controlled thickness, the reticle-preparing process becomes very complicated.

SUMMARY OF THE INVENTION

Under this background, an object of the present invention is to provide a reticle in which an effect equivalent to the effect attained by the multiple stage phase shifter forming process can be attained by a single layer process.

According to the present invention, this object is attained by a reticle in which a 180° phase shifter is uniformly formed on a glass substrate of the reticle, and the edge of the phase shifter is tapered by etching at the step of forming a shifter pattern.

DESCRIPTION OF THE PREFERRED EMBODIMENTS

According to the present invention, by adopting the above-mentioned structure, a shifter pattern in which the formation of an unnecessary pattern due to a reduction of the intensity of the transmitted light in the boundary area between the glass substrate of the reticle and the 180° phase shifter does not occur can be prepared by the single layer process.

Figure 1A:
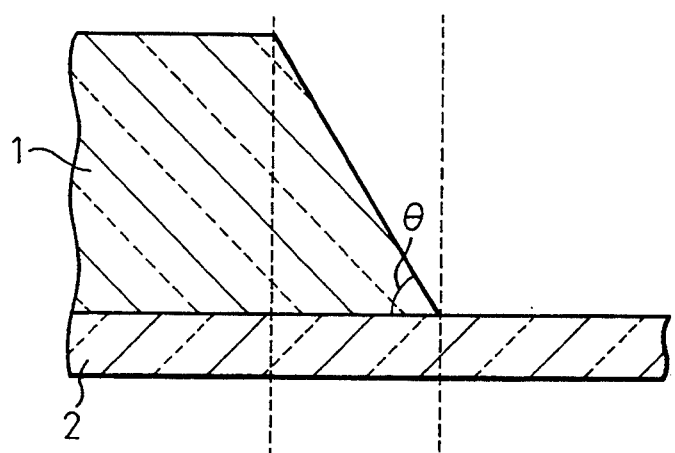
FIG. 1a is a diagram illustrating the section of a reticle according to one embodiment of the present invention.

An embodiment of the present invention will now be described with reference to the accompanying drawings. FIG. 1a is a diagram illustrating the section of one embodiment of the reticle of the present invention.

Figure 1B:
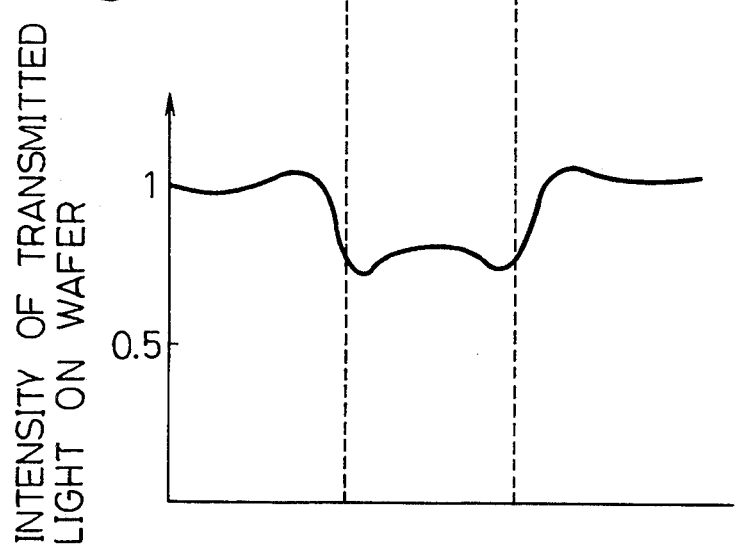
FIG. 1b is a diagram illustrating the intensity of the light exposed on a wafer.

The edge of a 180° phase shifter 1 on a glass substrate 2 of the reticle has a tapered structure, and thus a reduction of the intensity of the transmitted light by an interference in the boundary area between the phase shifter 1 and the glass substrate 2 is controlled as shown in FIG. 1b.

Figure 2A:
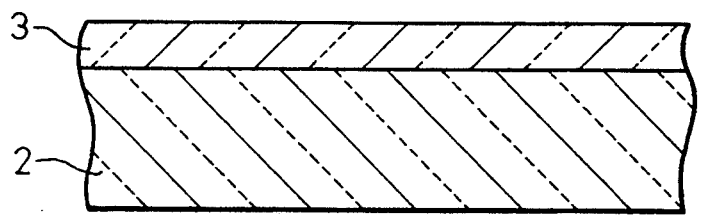
FIGS. 2a–2c are diagrams showing an embodiment of the method of tapering the shifter edge.
Figure 2B:
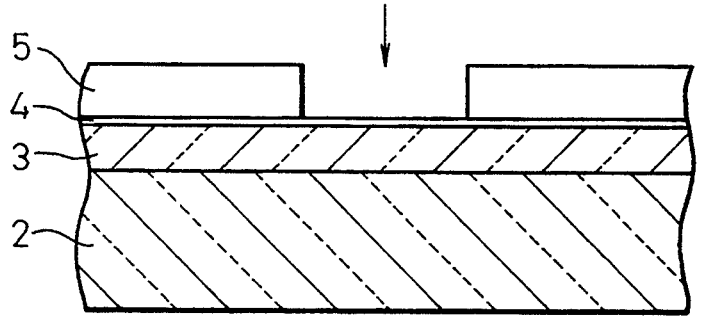
Figure 2C:
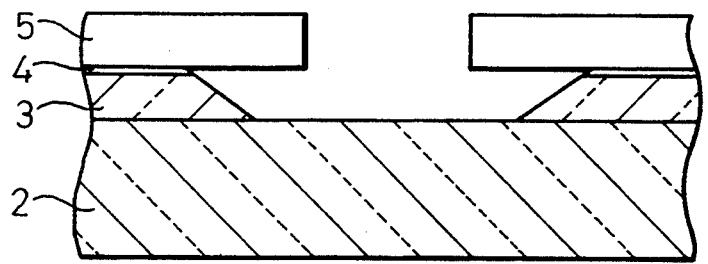
Figure 3A:
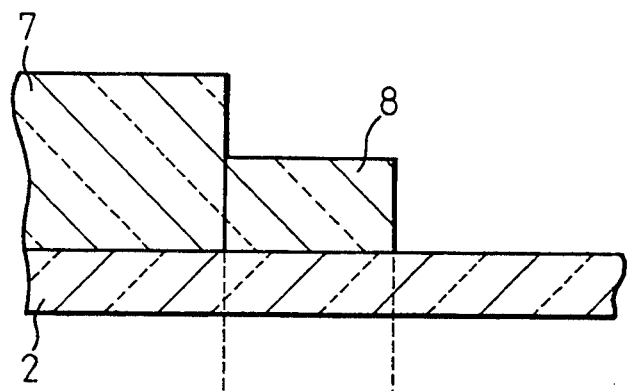
FIG. 3a is a diagram illustrating the section of the reticle in the conventional multiple stage phase shifter process.
Figure 3B:
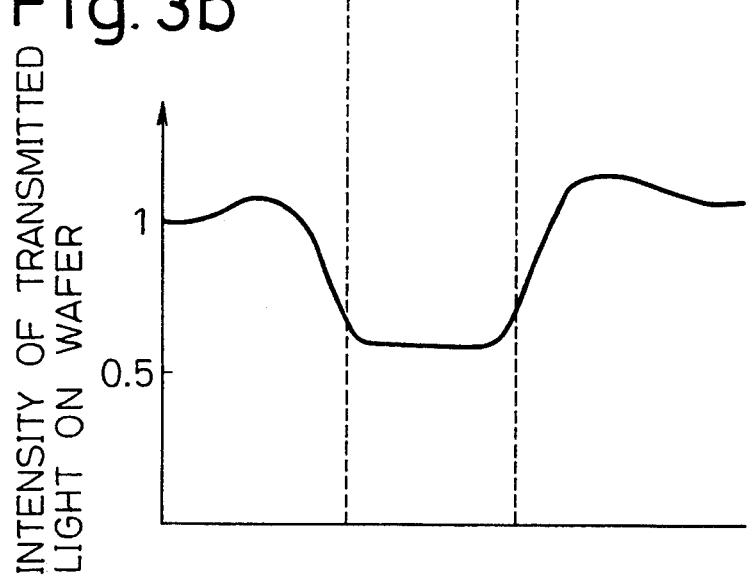
FIG. 3b is a diagram illustrating the intensity of the light exposed on the wafer in the conventional reticle.

FIGS. 2a through 2c are diagrams illustrating the process of forming the shifter edge, wherein SOG as the phase shifter is formed at a baking temperature of 400° C. on the glass substrate 2 (synthetic quartz) of the reticle by coating. The refractive index of the formed SOG film 3 is 1.42, and if the exposure light is an i-ray (wavelength: 365 nm), the thickness of the SOG film acting as the 180° shifter is 435 nm (see FIG. 2a).

Next, the surface of the SOG film is subjected to an $O_2$ plasma treatment to form a plasma treatment layer 4 and reduce the adhesion to a resist, and then a resist 5 is coated and a pattern is transferred by photolithography. Thereafter, a wet etching is carried out with a solution of hydrofluoric acid (see FIG. 2b).

Accordingly, a turn-around of the etchant occurs between the shifter film and the resist, and a tapered structure is formed on the edge of the shifter as shown in FIG. 2c.

The SOG film formed by the coating method (the baking temperature is 400° C.) has an etching rate with hydrofluoric acid about 10 times as high as synthetic quartz, as the glass substrate of the reticle, and therefore, substantially no influence is imposed on the glass substrate 2 of the reticle.

The thickness D of the 180° phase shifter can be determined from the wavelength λ of the exposure light and the refractive index n of the shifter material according to the following relationship formula:

$$D=(\lambda/2)/(n-1)$$

Examples of the thickness of the 180° phase shifter obtained from various combinations of the shifter material and the exposure light are shown in the following table.

| Exposure Light (wavelength) | Shifter Material (refractive index) | | |
| --- | --- | --- | --- |
| | SOG (1.44) (spin-on glass) | CVDSiO2 (1.47) (chemical vapor deposition) | PMMA (1.49) (polymethyl methacrylate) |
| Hg lump g-ray (436 nm) | 495 nm | 464 nm | 445 nm |
| Hg lump i-ray (365 nm) | 415 nm | 388 nm | 372 nm |
| Exicimer laser XeCl (308 nm) | 350 nm | 328 nm | 314 nm |
| Exicimer laser KrF (248 nm) | 282 nm | 264 nm | 253 nm |

-continued

| Exposure Light (wavelength) | Shifter Material (refractive index) | | |
| --- | --- | --- | --- |
| | SOG (1.44) (spin-on glass) | CVDSiO$_2$ (1.47) (chemical vapor deposition) | PMMA (1.49) (polymethyl methacrylate) |
| Exicimer laser ArF (193 nm) | 219 nm | 205 nm | 197 nm |

In the phase shifter constructed in the above-mentioned manner, the taper angle $\theta$ (see FIG. 1a) of the tapered structure of the pattern edge of the phase shifter is preferably 50° to 80°.

If the taper angle $\theta$ exceeds 80°, an effect of controlling the attenuation of the light is not obtained, and thus such a large taper angle is not preferred. If the taper angle $\theta$ is smaller than 50°, good results are not attained with respect to the effect of making the device pattern fine.

As is apparent from the foregoing description, the present invention is advantageous in that a shifter pattern can be formed by the single layer process, compared with the multiple stage shifter process in which a plurality of shifter films, the thickness of which is controlled at a very high precision, must be formed.

We claim:

1. A photo mask for forming a light exposure pattern in a photolithography process of a fabricating semiconductor device, comprising:
   a glass substrate; and,
   a phase shifter formed as a pattern on the glass substrate, the edge of said phase shifter having a tapered structure.

2. A photo mask as set forth in claim 2, wherein the phase shifter is composed of spin-on glass.

3. A photo mask as set forth in claim 2, wherein the phase shifter is composed of chemical vapor deposition SiO$_2$.

4. A photo mask as set forth in claim 2, wherein the phase shifter is composed of polymethyl methacrylate.

5. A photo mask as set forth in claim 2, wherein the taper angle of the taper structure of the phase shifter is 50° to 80°.

6. A photo mask as set forth in claim 2, wherein the glass substrate is composed of synthetic quartz.

7. A photo mask for forming a light exposure pattern in a photolithography process of a fabricating semiconductor device, comprising:
   a substrate composed of synthetic quartz; and,
   a phase shifter formed as a pattern on the substrate and composed of spin-on glass, wherein the pattern edge of said phase shifter has a tapered structure and the taper angle is 50° to 80°.

8. A photo mask as set forth in claim 7, wherein the thickness D of the phase shifter satisfies the following requirement:

$$D=(\lambda/2)/(n-1)$$

wherein N represents the refractive index of the material of the phase shifter and X represents the wavelength of the exposure light.

9. A reticle having a phase shifter, comprising:
   a glass substrate; and,
   a phase shifter formed as a pattern on the glass substrate, said phase shifter having a tapered structure edge.

10. A reticle as set forth in claim 9, wherein the phase shifter is composed of spin-on glass.

11. A reticle as set forth in claim 9, wherein the phase shifter is composed of chemical vapor deposition SiO$_2$.

12. A reticle as set forth in claim 9, wherein the phase shifter is composed of polymethyl methacrylate.

13. A reticle as set forth in claim 9, wherein the taper angle of the taper structure of the phase shifter is 50° to 80°.

14. A reticle as set forth in claim 9, wherein the glass substrate is composed of synthetic quartz.

* * * * *